(12) United States Patent  
Murayama et al.

(10) Patent No.: US 6,522,719 B2
(45) Date of Patent: Feb. 18, 2003

(54) METHOD AND APPARATUS FOR MEASURING A BUMP ON A SUBSTRATE

(75) Inventors: Kei Murayama, Nagano (JP); Mitsutoshi Higashi, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 0 days.

(21) Appl. No.: 09/881,004

(22) Filed: Jun. 14, 2001

(65) Prior Publication Data

US 2001/0053197 A1 Dec. 20, 2001

(30) Foreign Application Priority Data

Jun. 14, 2000  (JP) ........................................ 2000-177916

(51) Int. Cl.⁷ .............................................. G01N 23/06
(52) U.S. Cl. ........................................ 378/54; 378/58
(58) Field of Search ................................ 378/54–56, 58

(56) References Cited

U.S. PATENT DOCUMENTS 4,607,380 A * 8/1986 Oliver ........................... 378/58

* cited by examiner

Primary Examiner—Craig E. Church
(74) Attorney, Agent, or Firm—Paul & Paul

(57) ABSTRACT

A method for measuring a height of a bump formed on a work of substrate, the method comprising: irradiating X-rays having a predetermined wavelength and an incident intensity toward a first work of substrate which is the same as the above-mentioned work of substrate, but no bump is formed thereon, and detecting a first X-ray transmitted intensity at a position on which the bump is to be formed; irradiating X-rays having the same wavelength and incident intensity toward a material constituting the bumps and detecting a linear absorption coefficient of the X-rays; memorizing the first X-ray transmitted intensity and the linear absorption coefficient as known data; and irradiating X-rays having the same wavelength and the same incident intensity toward a second work of substrate which is the same as the above-mentioned work of substrate, but bump is formed thereon, and detecting a second X-ray transmitted intensity at a position on which the bump is formed; and determining the height of the bump from the second X-ray transmitted intensity on the basis of the known data.

10 Claims, 5 Drawing Sheets

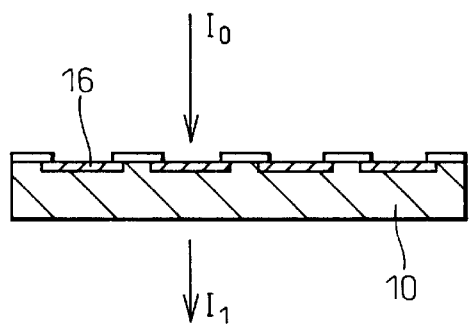
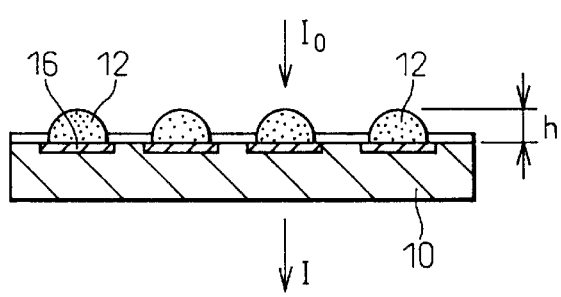
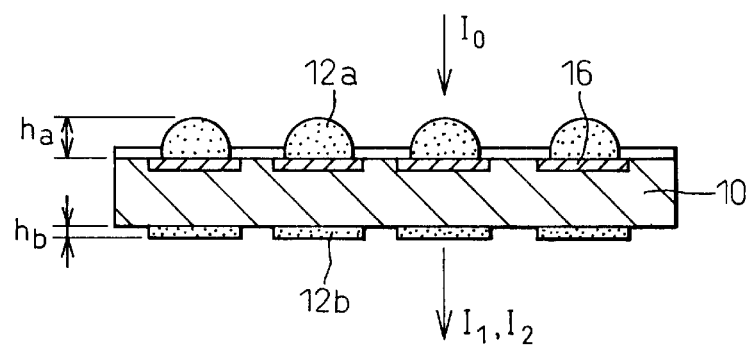

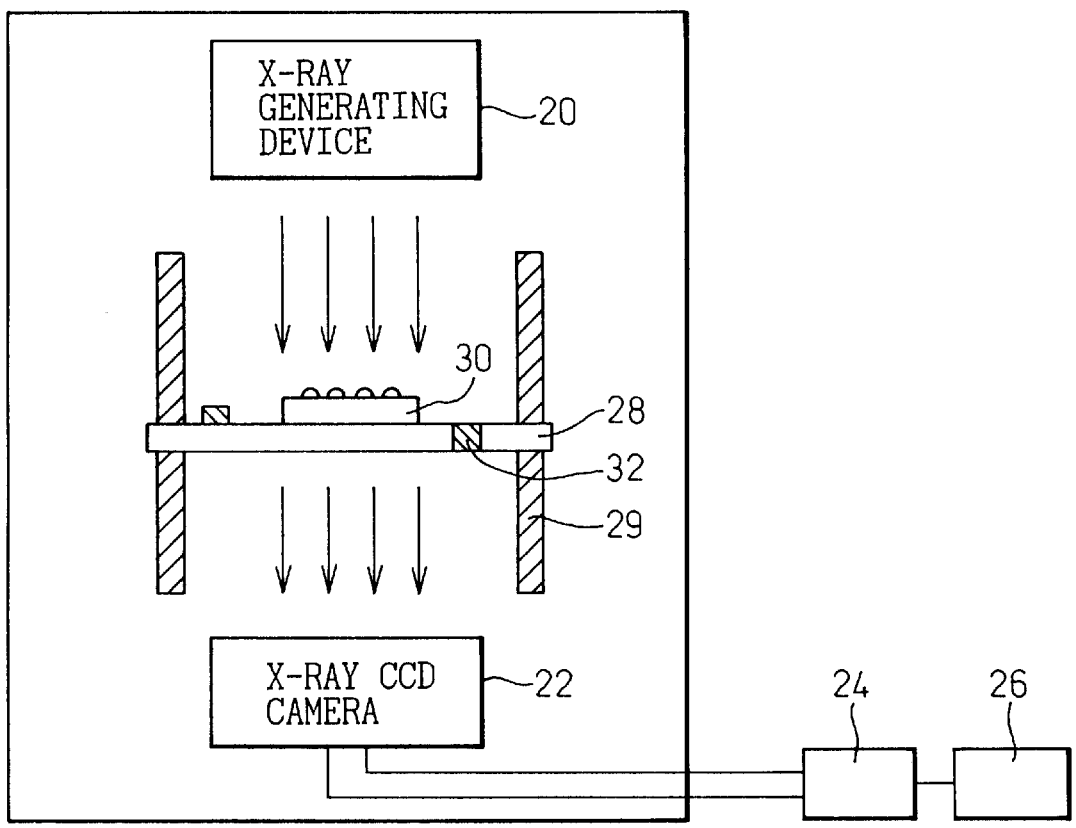

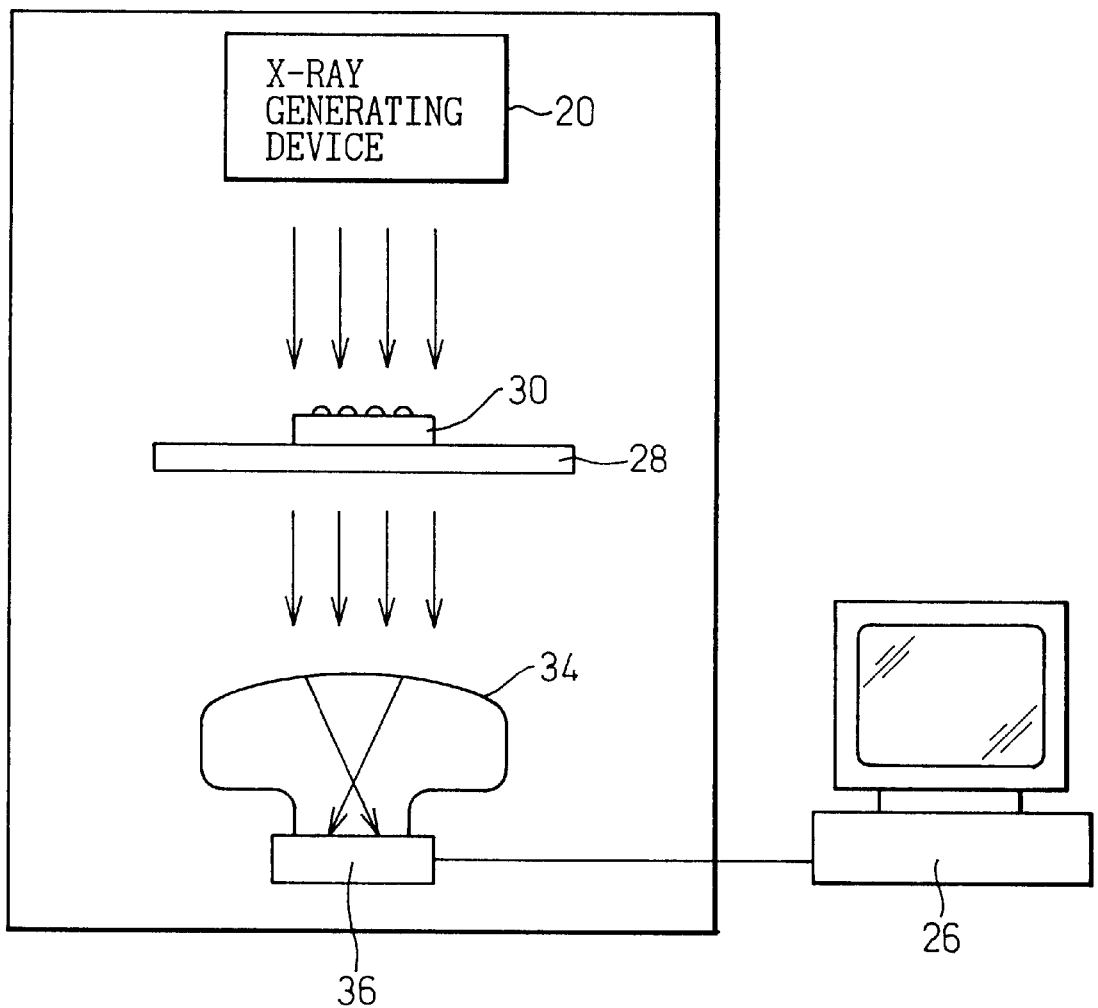

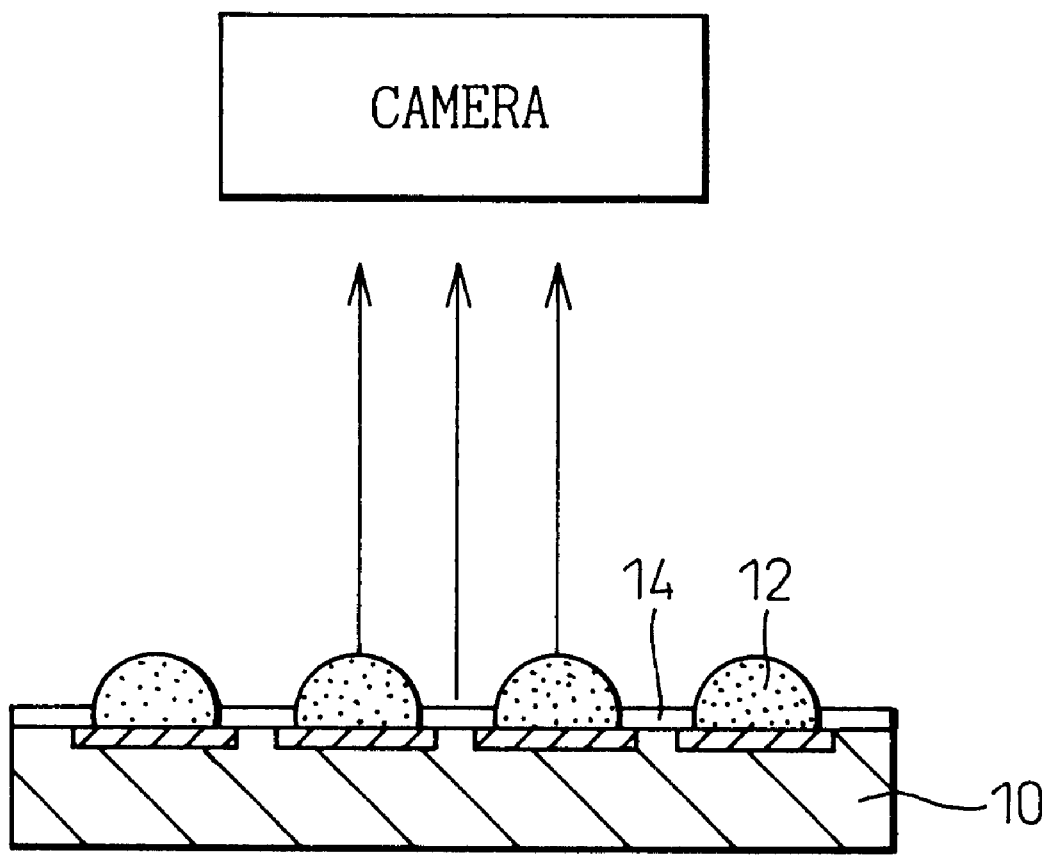

METHOD AND APPARATUS FOR MEASURING A BUMP ON A SUBSTRATE

DETECTING BACKGROUND OF THE INVENTION

1. Field of the Invention

The present invention relates to a method and an apparatus for advantageously measuring heights of bumps, such as connecting terminals provided on a semiconductor package, such as BGA (ball grid array) package, or flip-chip connection bumps by which a semiconductor chip is mounted on a substrate.

2. Description of the Related Art

A surface-mount type semiconductor device, such as a BGA substrate, is commonly provided on a surface of the substrate with semi-spherical bumps formed as external connecting terminals. These bumps can be formed by adhering solder balls to lands provided on the surface of the substrate. However, in the production of such a semiconductor device, when the dimension in the radial direction of the bumps is small and when the bumps are densely arranged, the bumps are generally formed as follows. That is to say, a solder paste is supplied onto the lands by a printing method to reflow the solder paste so as to form the bumps on the substrate. In this case, however, if the amount of solder paste to be supplied onto the lands fluctuates, the height or size of the bumps will not uniform.

Therefore, in a semiconductor device in which bumps are formed on a surface of the substrate as external connecting terminals, the height of the bumps must be measured by a suitable measuring device after the bumps are formed on the substrate. In a measuring device known in the prior art, an optical method is generally used to detect the height of the bumps.

FIG. 6 schematically shows a method for optically detecting the height of the bumps 12 formed on a substrate 10. The height of the bumps 12 is measured by a suitable measuring device after the bumps are formed on the substrate. One of the methods for optically detecting the height of the bumps is a method in which a surface of protective film 14, such as solder resist film, covering the surface of the substrate 10 is defined as a reference surface and a distance from this reference surface to the top of the bumps 12 is then optically detected. Otherwise, also known is a method in which the shape of the top of bumps is flattened by a coining process and then the flattened top portion of the bump is optically detected to measure the height of bumps.

However, in the prior art method for optically detecting the height of the bumps, the optical reflection rate is significantly different case by case and greatly depends on a gloss of the bumps and, therefore, the accuracy of the measured results may fluctuate due to a fluctuation of the state of the bumps. In the case that the height of bumps are measured on the basis of a surface of the protective film 14, as the reference surface, the measuring accuracy is lowered since the height of bumps from the referenced surface fluctuates because the thickness of the solder resist as the protective film fluctuates. In addition, if there is any warp on the surface, the optical focus is deviated and therefore an accurate measurements cannot be expected.

In addition, since the number of terminals has been gradually increased in recent semiconductor devices having fine connecting terminals, a high accuracy in the measuring results of the height of bumps has been more and more required. As mentioned above, the deviations of the height of bumps are caused by the fact that the amount of solder paste which should be supplied to the individual lands fluctuates or the amount of flux contained in the solder paste fluctuates. In the case of bumps having a height of several hundred $\mu$m, a deviation in the amount of solder paste is not a significant problem. However, if the bumps have a lower height, such as the heights of bumps being several tens of $\mu$m, the height and size of the bumps are greatly affected by even small deviations in the amount of solder paste.

Also, in the case of the size of bumps being small, if a surface which might easily deviate, such as the surface of the protective film of the solder resist or the like, is used as the reference surface, the accuracy will be reduced and, also, even a small warp in the substrate causes reduced accuracy.

SUMMARY OF THE INVENTION

An object of the present invention is to provide a method and an apparatus for accurately measuring the height of bumps formed on a semiconductor package or substrate.

Another object of the present invention is to provide a method and an apparatus for measuring the height of bumps in which the above-mentioned drawbacks in the prior art can be overcome.

According to the present invention, there is provided a method for measuring a height of a bump formed on a work of substrate, said method comprising: irradiating X-rays having a predetermined wavelength and incident intensity toward a first work of substrate which is the same as the above-mentioned work of substrate, but no bump is formed thereon, and detecting a first X-ray transmitted intensity at a position on which the bump is to be formed; irradiating X-rays having the same wavelength and incident intensity toward a material constituting the bumps and detecting a linear absorption coefficient of the X-rays; memorizing the first X-ray transmitted intensity and the linear absorption coefficient as known data; and irradiating X-rays having the same wavelength and the same incident intensity toward a second work of substrate which is the same as the above-mentioned work of substrate, but a bump is formed thereon, and detecting a second X-ray transmitted intensity at a position on which the bump is formed; and determining the height of the bump from the second X-ray transmitted intensity on the basis of the known data.

According to another aspect of the present invention, there is provided a method for measuring heights of first and second bumps formed on first and second surfaces, respectively, of a work of substrate in which materials of the first and second bumps are different from each other, a planar arrangement of the first bumps is the same as that of the second bumps, said method comprising: irradiating at least two kinds of X-rays having different wavelengths toward the materials constituting the first and second bumps, respectively, and detecting first and second linear absorption coefficients of the X-ray; memorizing the first and second linear absorption coefficients of the X-rays as known data; and irradiating the two kinds of X-ray toward the first and second works respectively, and detecting the first and second X-ray transmitted intensities at a position on which the first and second bumps are formed; and determining the heights of the first and second bumps from the first and second X-ray transmitted intensities on the basis of the known data.

According to still another aspect of the present invention, there is provided an apparatus for detecting a height of bumps, said apparatus comprising: a stage on which a work of substrate having a plurality of bumps formed thereon is disposed; a X-ray generating unit for generating X-rays incident to the work; and a detecting unit for detecting an intensity of X-rays transmitted through the work at a position where the bump is located.

The detecting unit may comprise a CCD camera for detecting the intensity of X-rays transmitted through the work, and an analyzing unit for analyzing an image data output from the CCD camera to detect the intensity of X-rays transmitted through the bump.

Otherwise, the detecting unit may comprise an image intensifier for detecting the intensity of X-rays transmitted through the work, and an analyzing unit for analyzing an image data output from the image intensifier to detect the intensity of X-rays transmitted through the bump.

Alternatively, the detecting unit may comprise a photomultiplier tube for detecting the intensity of X-ray transmitted through the work, and an analyzing unit for analyzing an image data output from the photomultiplier tube to detect the intensity of X-rays transmitted through the bump.

BRIEF DESCRIPTION OF THE DRAWINGS

FIGS. 1(a) and 1(b) are schematic illustrations of a method for measuring the height of the bumps using X-rays according to the present invention;

FIG. 2 is a schematic illustration of a method for measuring the height of the bumps provided on the respective surfaces of a substrate according to the present invention;

FIG. 3 is a schematic illustration of an embodiment of a bump height measuring apparatus according to the present invention;

FIG. 4 is a schematic illustration of another embodiment of a bump measuring apparatus according to the present invention;

FIG. 6 is a schematic illustration of a method for measuring the height of the bumps known in the prior art.

DETAILED DESCRIPTION OF THE PREFERRED EMBODIMENTS

Figure 5:
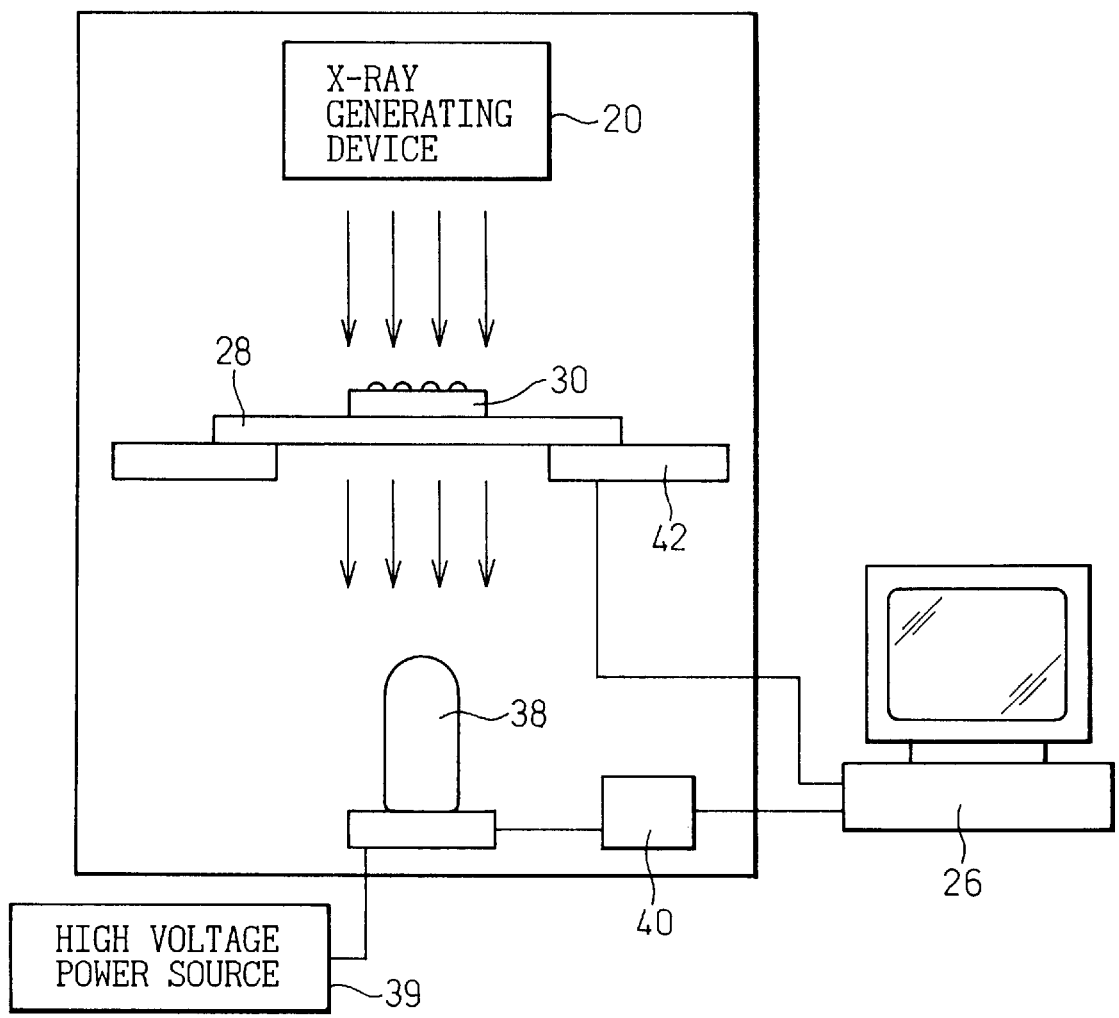
FIG. 5 is a schematic illustration of still another embodiment of a bump height measuring apparatus according to the present invention.

Referring now to the drawings, wherein FIGS. 1(a) and 1(b) show a method for measuring the height of the bumps provided on a semiconductor substrate using X-rays according to the present invention. In the bump detecting method according to this invention, X-rays are irradiated onto the work and the intensity of X-rays which transmit through the work is measured to determine the heights of the bumps.

In the measuring method of FIGS. 1(a) and 1(b), the measurement results for one sample, wherein a bump 12 is not formed on the land 16 of the substrate 10, and the measurement results for another sample, wherein a bump 12 is formed on the land 16 of the substrate 10, are compared to each other to determine the height of bump 12.

As shown in FIG. 1(a), in the case of no bump being formed, if the intensity of incident X-ray is $I_0$ and the intensity of transmitted X-ray is $I_1$, the following relationship between $I_0$ and $I_1$ is given. In the following representation, $\mu_1$ is Planck's linear absorption coefficient.

$$I_1 = I_0 \exp(-\mu_1 x) \quad (1)$$

On the other hand, as shown in FIG. 1(b), in the case of bump 12 being formed on the land 16, if the intensity of incident X-rays is $I_0$ and the intensity of transmitted X-rays is I, the following relationship between $I_0$ and I is given. In the following representation, $\mu_B$ is a linear absorption coefficient of the material constituting the bumps and h is the height of bump.

$$I = \{I_0 \exp(-\mu_1 x)\} \cdot \exp(-\mu_B h) = I_1 \cdot \exp(-\mu_B h) \quad (2)$$

The relationship between I and $I_1$ can be deformed as follows.

$$h = -\{l_n(I/I_1)\}/\mu_B \quad (3)$$

According to this representation, if the intensity $I_1$ of transmitted X-rays in the state that no bumps 12 are formed on the lands 16 is measured beforehand and, on the other hand, if the linear absorption coefficient $\mu_B$ of the material constituting the bumps 12 is measured beforehand, the height (h) of bumps can be detected by only measuring the intensity of transmitted X-rays in the state that the bumps 12 are formed on the lands 16.

The thickness of the lands 16 formed on the substrate 10 is relatively thin, about 18 $\mu$m, the deviation of the thickness is relatively small, and in general the linear absorption coefficient is relatively small. Therefore, the lands 16 do not result in a great influence to the measuring results. Therefore, it is sufficient to measure the intensity ($I_1$) of transmitted X-rays with respect to the samples of substrate having no bumps to use the measured results as a reference value.

The intensity $I_1$ of transmitted X-rays with respect to the samples of substrate having no bumps 12 formed on the lands 16 reflects the intensity of transmitted X-rays through the land 16 as well as the intensity of transmitted X-rays through the base body of the substrate 10. Therefore, the measuring method of this embodiment can be used for detecting the height of bumps 12, either for a substrate having no inner conductive layer other than the lands 16, as well as a substrate having such an inner conductive layer. This is because the height of bumps 12 can be determined in such a manner that the intensity of transmitted X-ray with respect to the substrate having no bumps 12 is defined as a reference value and then the difference is determined.

The wavelength of the X-rays which transmit through the work can be optionally selected. Therefore, depending on the bumps to be measured, the absorption spectrum of X-ray is measured beforehand and the wavelength of X-ray which is the most favorable for measuring can be determined. For example, if the bumps 12 are formed of solder, the absorption spectrum of X-ray with respect to solder is measured beforehand. Thus, it is possible to measure using X-rays having such a wavelength of large linear absorption coefficient. Since the absorption spectrum may be different depending on the products even if the substrate itself is the same kind, it is effective to measure the absorption spectrum of X-rays to use the optimum wavelength.

FIG. 2 shows an example wherein the bumps 12a and 12b are provided on the respective surfaces of a substrate 10. As a product of the semiconductor device, there are many kind of such a substrate having the respective surfaces of a substrate 10 on which the. bumps 12a and 12b are formed. If the materials of the bumps 12a and 12b formed on the respective surfaces of the substrate are different from each other, such as, if the bumps 12a on one of the surfaces are formed of tin-lead and the bumps 12b on the other surface are formed of tin-silver, the respective heights $h_a$ and $h_b$ of the bumps 12a and 12b can be detected.

In order to detect the respective heights $h_a$ and $h_b$ of the bumps 12a and 12b formed on the respective surfaces of the substrate, two or more types of X-rays having different wavelength can be used to measure the intensity of the transmitted X-ray.

That is to say, if the intensities of X-rays, the wavelength thereof being $\lambda_1$ and $\lambda_2$, are $I_1$ and $I_2$ respectively; the linear absorption coefficients of the material constituting the bumps 12a and 12b respectively for X-rays, the wavelength thereof being $\lambda_1$ and $\lambda_2$, are $\mu_{a1}, \mu_{a2}, \mu_{b1}$ and $\mu_{b2}$, $I_1$ and $I_2$ are given by the following representations.

$$I_1 = I_0 \exp(-\mu_{a1} h_a) \cdot \exp(-\mu_{b1} h_b) \quad (4)$$

$$I_2 = I_0 \exp(-\mu_{a2} h_a) \cdot \exp(-\mu_{b2} h_b) \quad (5)$$

In this representations, $\mu_{a1}, \mu_{a2}, \mu_{b1}$, and $\mu_{b2}$ are given beforehand by measurements and $I_1$ and $I_2$ can be given as the results of measurements. Therefore, the heights $h_a$ and $h_b$ of the bumps 12a and 12b can thus be obtained from the above-mentioned representations (4) and (5).

In order to measure the height of the bumps by detecting the intensity of the transmitted X-rays, it is necessary to measure the respective intensity of the transmitted X-rays for the respective bumps. In this connection, FIGS. 3 to 5 show some examples of measuring apparatus for measuring the intensity of the transmitted X-ray. The embodiment shown in FIG. 3 uses an X-ray CCD camera, the embodiment shown in FIG. 4 uses X-ray image intensifier, and the embodiment shown in FIG. 5 is a measuring apparatus using a photomultiplier tube.

The bump detecting apparatus shown in FIG. 3 comprises a X-ray generating device for generating X-rays which should be incident to the work 30 and a CCD camera 22 for detecting X-ray transmitted through the work 30. The image data detected by the X-ray CCD camera 22 is converted to a digital value by an AD converter 24 and detected by a computer 26 as an intensity of transmitted X-ray. The apparatus further includes a stage 28 on which works are set and a stage guide 29 for moving the stage 28 in the direction parallel to the optical axis of the CCD camera to regulate the focus position of the work 30.

As mentioned above, as far as both the linear absorption coefficient ($\mu_B$) of the material constituting the bumps of the work 30 and the intensity ($I_1$) of transmitted X-rays of the substrate having no bumps are available in advance, the height of the bumps can be determined by detecting the intensity of transmitted X-rays transmitted through the work 30. In the computer 26, the respective intensities (I) of X-ray transmitted through the respective bumps of the work 30 and the linear absorption coefficient ($\mu_B$) and the intensities ($I_1$) of transmitted X-rays are analyzed to determined the height ($h_B$) of bumps. From these detected results, whether the bumps have a predetermined dimension of height or not can be determined to discriminate allowable and non-allowable products. In this embodiment, the CCD camera 22 and the AD converter 24 constitute detecting means and the computer 26. constitutes an analyzing means.

In the embodiment as shown in FIG. 3, a standard sample 32 can be provided for correcting the intensity of X-rays. The standard sample 32 is disposed on the stage 28 and the X-ray transmitted intensity with respect to the standard sample 32 is detected by the X-ray CCD camera 22, thereby the intensity of the incident X-rays can be regulated. Otherwise, the results of measurements can be revised in accordance with the intensity of the incident X-rays.

In the embodiment of FIG. 4, X-rays are incident toward the work 30 from the X-ray generating device 20 and the X-rays transmitted through the work 30 are incident on the X-ray image intensifier 34. The X-ray image intensifier 34 converts the weak X-ray image into a visible image and a digital CCD camera 36 is arranged at the optical output side. Thus, the X-ray transmitted image of the work 30 can be output to the computer 26 as a digital image. In the computer, the X-ray permeability of the respective bumps are analyzed from the digital image of the works 30 and the heights of the respective bumps can thus be detected on the basis of these data.

Since the X-ray image intensifier 34 has a high image quality, even though a large number of fine bumps are highly densely arranged on the work 30, the bumps can be accurately detected. Also, as the X-ray image intensifier 34 can detect a relatively wide image range, if the work itself is small in size, as a semiconductor device, it is possible to measure at all the bumps once. In this embodiment, a standard sample can be used for correcting the intensity of the incident X-rays. In this embodiment, the X-ray image intensifier 34, the digital CCD camera 36 and the computer 26 constitute a detecting device.

FIG. 5 shows a further embodiment of a measuring apparatus for detecting the transmitted X-ray intensity, in which X-rays are incident toward the work 30 from the X-ray generating device 20, the X-rays transmitted through the work 30 are detected by a photomultiplier tube 38 and thus the intensity of X-rays transmitted through the work can be measured. The photomultiplier tube 38 serves to amplify the photoelectron energized by the X-rays and the data counted by a photon counter 40 is input into the computer 26. A high voltage power 39 supplies power to actuate the photomultiplier tube 38.

In the measuring method using the photomultiplier tube 38, the count number of the respective bumps of the work are individually measured to detect the intensity of transmitted X-rays. Therefore, the work 30 must be moved for each bump with respect to the photomultiplier tube 38. In this embodiment, a stage 28 is supported on a movable stage 42 and the position of the movable stage 42 is controlled by the computer 26.

The output (count number) from the photomultiplier tube 38 is memorized by the computer for each bump of the work 30 and thus the intensity of transmitted X-rays can be measured for all of the bumps of the work 30. The process for detecting the height of the individual bumps from the intensity of transmitted X-ray is the same as that of the previous embodiments. Although the detecting method using the photomultiplier tube 38 is complicated as the detecting process must be performed for each bump, a more precise measurement can be expected. In this embodiment, the photomultiplier tube 38, the photon counter 40 and the computer 26 constitute a detecting device.

As mentioned above, according to the present invention, since the height of the bumps is measured using X-rays transmitted through the work, the following advantages can be obtained. That is to say, a precise measurement can be effected regardless of the nature of the object, such as the gloss of the bumps. Also, as the height of the bumps from the land can be measured by using transmitted X-rays, it is no longer necessary to measure the height of bumps using a protective film, such as a solder resist, as in the prior art. Therefore, there are no fluctuations in the measurement results due to deviations in the thickness of protective film. This is particularly advantageous when a semiconductor element is mounted on a substrate by flip-chip connection using bumps densely arranged on the substrate.

In addition, according to the measuring method of this invention, any warps of the substrate do not affect the measured heights of bumps.

It should be understood by those skilled in the art that the foregoing description relates to only some of the preferred embodiments of the disclosed invention, and that various changes and modifications may be made to the invention without departing the sprit and scope thereof.

What is claimed is:

1. A method for measuring a height of a bump formed on a work of substrate, said method comprising:

irradiating X-rays, having a predetermined wavelength and an incident intensity, toward a first work of substrate which is the same as the above-mentioned work of substrate, but no bump is formed thereon, and detecting a first X-ray transmitted intensity at a position at which the bump is to be formed;

irradiating X-rays having the same wavelength and incident intensity toward a material constituting the bumps and detecting a linear absorption coefficient of the X-ray;

memorizing the first X-ray transmitted intensity and the linear absorption coefficient as known data; and irradiating X-rays having the same wavelength and the same incident intensity toward a second work of substrate which is the same as the above-mentioned work of substrate, but a bump is formed thereon, and detecting a second X-ray transmitted intensity at a position on which the bump is formed; and determining the height of the bump from the second X-ray transmitted intensity on the basis of the known data.

2. A method for measuring heights of first and second bumps formed on first and second surfaces, respectively, of a work of substrate in which materials of the first and second bumps are different from each other, a planar arrangement of the first bumps being the same as that of the second bumps, said method comprising:

irradiating at least two kinds of X-rays having different wavelengths toward the materials constituting the first and second bumps, respectively, and detecting first and second linear absorption coefficients of the X-rays;

memorizing the first and second linear absorption coefficients of the X-rays as known data; and irradiating the two kinds of X-rays toward the first and second works respectively, and detecting the first and second X-ray transmitted intensities at a position on which the first and second bumps are formed; and determining the heights of the first and second bumps from the first and second X-ray transmitted intensities on the basis of the known data.

3. An apparatus for detecting a height of bumps, said apparatus comprising:

a stage on which a work of substrate having a plurality of bumps formed thereon is disposed;

a X-ray generating unit for irradiating X-rays, having a predetermined wavelength and an incident intensity, toward a first work of substrate which is the same as said work of substrate, but no bump is formed thereon, toward a material constituting the bumps, and toward a second work of substrate which is the same as the above-mentioned work of substrate, but a bump is formed thereon;

a detecting unit for detecting a first X-ray transmitted intensity of said first work at a position at which the bump is to be formed, a linear absorption coefficient of the X-ray of said material, and detecting a second X-ray transmitted intensity of said second work at a position on which the bump is formed;

a unit for memorizing the first X-ray transmitted intensity and the linear absorption coefficient as known data; and a unit for determining the height of the bump from the second X-ray transmitted intensity on the basis of the known data.

4. An apparatus as set forth in claim 3, wherein the detecting unit comprises a CCD camera for detecting the intensity of X-rays transmitted through the work, and an analyzing unit for analyzing an image data output from the CCD camera to detect the intensity of X-ray transmitted through the bump.

5. An apparatus as set forth in claim 3, wherein the detecting unit comprises an image intensifier for detecting the intensity of X-rays transmitted through the work, and an analyzing unit for analyzing an image data output from the image intensifier to detect the intensity of X-rays transmitted through the bump.

6. An apparatus as set forth in claim 3, wherein the detecting unit comprises a photomultiplier tube for detecting the intensity of X-rays transmitted through the work, and an analyzing unit for analyzing an image data output from the photomultiplier tube toe detect the intensity of X-rays transmitted through the bump.

7. An apparatus for detecting heights of first and second bumps formed on first and second surfaces, respectively, of a work of substrate in which materials of the first and second bumps are different from each other, a planar arrangement of the first bumps being the same as that of the second bumps, said apparatus comprising:

a stage on which said work of substrate is disposed;

a X-ray generating unit for irradiating at least two kinds of X-rays having different wavelengths toward the materials constituting the first and second bumps, respectively;

a detecting unit for detecting first and second linear absorption coefficients of the X-rays, and detecting the first and second X-ray transmitted intensities at a position on which the first and second bumps are formed;

a unit for memorizing the first and second linear absorption coefficients of the X-rays as known data; and a unit for determining the heights of the first and second bumps from the first and second X-ray transmitted intensities on the basis of the known data.

8. An apparatus as set forth in claim 7, wherein the detecting unit comprises a CCD camera for detecting the intensity of X-rays transmitted through the work, and an analyzing unit for analyzing an image data output from the CCD camera to detect the intensity of X-ray transmitted through the bump.

9. An apparatus as set forth in claim 7, wherein the detecting unit comprises an image intensifier for detecting the intensity of X-rays transmitted through the work, and an analyzing unit for analyzing an image data output from the image intensifier to detect the intensity of X-rays transmitted through the bump.

10. An apparatus as set forth in claim 7, wherein the detecting unit comprises a photomultiplier tube for detecting the intensity of X-rays transmitted through the work, and an analyzing unit for analyzing an image data output form the photomultiplier tube to detect the intensity of X-rays transmitted through the bump.

* * * * *